(12) United States Patent
Chang et al.

(10) Patent No.: US 6,297,151 B1
(45) Date of Patent: Oct. 2, 2001

(54) METHOD AND STRUCTURE FOR MANUFACTURING CONTACT WINDOWS IN SEMICONDUCTOR PROCESS

(75) Inventors: Julian Y. Chang; Da-Zen Chuang, both of Taipei (TW)

(73) Assignee: Nan Ya Technology Corporation, Taoyuan (TW)

( * ) Notice: Subject to any disclaimer, the term of this patent is extended or adjusted under 35 U.S.C. 154(b) by 0 days.

(21) Appl. No.: 09/639,128

(22) Filed: Aug. 15, 2000

Related U.S. Application Data

(63) Continuation of application No. 08/872,305, filed on Jun. 10, 1997, now Pat. No. 6,153,900.

(30) Foreign Application Priority Data

Apr. 14, 1997 (TW) ................................................ 86104764

(51) Int. Cl.[7] ................................................ H01L 21/4763
(52) U.S. Cl. ........................ 438/639; 438/637; 257/301
(58) Field of Search ............................ 257/301; 438/618, 438/622, 637, 639

(56) References Cited

U.S. PATENT DOCUMENTS

| | | | |
|---|---|---|---|
| 4,754,313 | * 6/1988 | Takemae et al. ........................ | 257/306 |
| 4,754,318 | * 6/1988 | Momose et al. ........................ | 257/775 |
| 5,498,889 | 3/1996 | Hayden ........................ | 257/301 |
| 5,677,866 | 10/1997 | Kinoshita ........................ | 365/156 |
| 5,723,889 | 3/1998 | Choi et al. ........................ | 257/329 |
| 5,731,610 | * 3/1998 | Rhodes ........................ | 257/309 |
| 5,998,822 | 12/1999 | Wada ........................ | 257/301 |

* cited by examiner

Primary Examiner—Amir Zarabian
Assistant Examiner—Christian D. Wilson
(74) Attorney, Agent, or Firm—Fish & Richardson P.C.

(57) ABSTRACT

The invention relates to a semiconductor process, and in particular to a method and structure of manufacturing contact windows between different levels of two conductive layers (a upper conductive layer and a lower conductive layer) in the semiconductor process. In the method, first, a trench is formed under a subsequently-formed contact window between the upper conductive layer and lower conductive layer. The trench may be located on the insulating layer under the lower conductive layer. When the lower conductive layer is subsequently formed, the trench can be filled with the lower conductive layer. Therefore, part of the lower conductive layer on the trench is thicker than that on the other regions. When the insulating layer between the upper conductive layer and lower conductive layer is formed, an etching process is then performed to form the contact window, the contact window can not cross the lower conductive layer due to the lower conductive layer on the trench being sufficiently thick. Accordingly, the contact area between the upper conductive layer and lower conductive layer is increased, thereby reducing the contact resistance thereof.

7 Claims, 6 Drawing Sheets

METHOD AND STRUCTURE FOR MANUFACTURING CONTACT WINDOWS IN SEMICONDUCTOR PROCESS

This application is a continuation of U.S. application Ser. No. 08/872,305, filed Jun. 10, 1997, now U.S. Pat. No. 6,153,900.

BACKGROUND OF THE INVENTION

1. Field of the Invention

The invention relates to a semiconductor process, and in particular to a method and structure for manufacturing contact windows between different levels of conductive layers in the semiconductor process. The method is suitable for manufacturing contact windows between the capacitors used for storing charges and interconnection layers or between different levels of conductive layers inside the memory cells of a dynamic random access memory (hereinafter referred to as "DRAM"). The structure of a contact window manufactured by means of the above-mentioned method can provide greater contact area between said capacitor and interconnection layer, thereby reducing the contact resistance thereof.

2. Description of Prior Art

Capacitors are very common components of semiconductor devices. Storage capacitors are especially widely utilized in DRAM memory cells. Generally, the DRAM memory cells consist of access transistors serving as switching devices, and storage capacitors. The gates of the access transistors are controlled by bit-lines. The sources and drains of the access transistors are connected to the storage capacitors and bit-lines, respectively. In addition, the other electrodes of the storage capacitors must be connected to other regions via an interconnection layer.

FIG. 1 is a flow chart illustrating a method for manufacturing a capacitor of a typical memory cell. The capacitor manufacturing according to the prior art will be described in FIG. 1. First, a substrate on which MOS (Metal-Oxide-Semiconductor) devices are already formed, is provided, wherein the MOS devices consist of gates, as well as sources and drains which are formed on the two sides of the gates, respectively (S1). According to the structure of the typically DRAM memory cell, a first insulating layer is deposited on the MOS devices, thereby separating the MOS devices from subsequently-formed capacitors, wherein the capacitors will be connected to the sources of the MOS devices (S2). First contact windows are formed on the first insulating layer for providing contact paths between the sources of the MOS devices and the subsequently-formed capacitors (S3). A first conductive layer for the capacitors is formed on the first insulating layer and first contact windows, so that the first conductive layer can be connected to the sources of the MOS devices via the first contact windows (S4). The first conductive layer is etched, thereby defining the shape and size of the capacitors (S5). After defining the dimensions of the capacitors, a dielectric layer and second conductive layer are formed in order on the first conductive layer by a deposition process (S6), so that the capacitors are completely fabricated. In general, in order to maintain high capacitance of the capacitors, the thickness of the dielectric layer should be minimized and the areas of the first conductive layer and second conductive layer should be maximized. After completing the above step, the required connection between the second conductive layer and interconnection layer is formed.

Similarly, a second insulating layer is formed on the second conductive layer of the capacitors, thereby separating the capacitors from a subsequently-formed interconnection layer (S7). Then, second contact windows are formed on appropriate positions (i.e., the regions which are separate from the capacitors and MOS devices) of the second insulting layer by an etching process in order to provide connection paths between the second conductive layer and the subsequently-formed interconnection layer (S8). Finally, an interconnection layer is formed on the second insulating layer and second contact windows, so that the interconnection layer can be connected to the second conductive layer of the capacitors via the second contact windows (S9).

In the S8, the contact areas between the interconnection layer and the second conductive layer can be controlled by the etching depth of the second insulting layer. Referring to FIG. 2, there is shown a cross-sectional view illustrating a contact window between the interconnection layer and the second conductive layer of a capacitor in accordance with a first example of the prior art. In the FIG. 2, the numerals 1,2,3,5 and 7 represent a first insulating layer, a dielectric layer of the capacitor, a second conductive layer of the capacitor, a second insulating layer and an interconnection layer, individually. It should be noted that the cross-sectional view in FIG. 2 does not show a position on which the capacitor is formed, but it is the position of a second contact window 6 via which the capacitor and the first conductive layer 7 are connected each other. Furthermore, part of the first conductive layer of the capacitor on this position is removed during S5 of defining the dimensions of the capacitor.

It is evident from FIG. 2 that part of the second conductive layer 3 of the capacitor is removed during an etching process to the insulating layer 5 in order to form the contact window 6. This is caused by there being different etching depth requirements for the contact windows at the same time. Generally, the contact window 6 in FIG. 2 belongs to a region on which an insulating layer need to be etched more thinly, while the source and drain of the MOS device belong to another region on which an insulating layer need to be etched more deeply. Therefore, deep etching is used in this process due to the region that needs to be etched deeply. Accordingly, part of the second conductive layer 3 of the capacitor is removed during the etching process, hence what is called overetching occurs. However, this over-etching may not in fact be deleterious. Taking FIG. 2 as an example, since the bottom of the contact window 6 does not cross the second conductive layer 3, this over-etching can actually increase the contact area between the interconnection layer 7 and the second conductive layer 3. The additional contact area is contributed by the side walls of the contact window which contact with the second conductive layer 3. Typically, the enlarged contact area means that the contact resistance between the second conductive layer 3 and the interconnection layer 7 is decreased.

However, such over-etching phenomena contains uncertainties ties. Although it can increase the contact area of the contact window under some circumstances, it may also greatly reduce the contact area under other circumstances. FIG. 3 is a cross-sectional view showing the contact window between a interconnection layer and a second conductive layer of a capacitor in accordance with a second example of the prior art. In this example, since the bottom of the contact window 6a crosses the dielectric layer 2, and even reaches to the second conductive layer 1, the contact area on the bottom of the contact window 6a is lost. Therefore, the inherent uncertainty of over-etching may increase the contact area or reduce the contact area depending on different circumstances.

In the prior art, the etching stopper is generally formed beneath the second conductive layer, thereby preventing the contact window from crossing the second conductive layer 3 of the capacitor. For example, in U.S. Pat. No. 4,754,318 "Semiconductor device", Momose et al., the same method is disclosed. However, the disadvantages of the above-mentioned method are that the cost is increased and excessive production processes are required. If the factors of cost and efficiency are taken into account, the method according to the prior art is not the best way to prevent decreasing the contact area.

As described above, the contact area can be increased under some over-etching circumstances. However, the method according to the prior art does not have this advantage. Therefore, the method of manufacturing the capacitor and contact window need to be modified so as to obtain the best performance.

Similarly, the same problem will be caused at the contact window between different levels of conductive layers, for example, the contact point between multi-layer interconnection layers. Accordingly, a new method and structure of manufacturing contact windows are necessarily provided to prevent the above-encountered problem from occurring during contact window manufacturing.

SUMMARY OF THE INVENTION

In view of the above, the first object of the invention is to provide a method for manufacturing contact windows in a semiconductor process, and more particularly to a method for manufacturing contact windows between capacitors and an interconnection layer. The method can prevent over-etching the conductive layer of the capacitor and thus producing a reduced contact area. Also, this method can be applied to contact window manufacturing between different levels of conductive layers with the same results.

The second object of the invention is to provide a method for manufacturing contact windows in a semiconductor process, and more particularly to a method for manufacturing contact windows between capacitors and an interconnection layer. The method can efficiently increase the contact area between the conductive layer of the capacitor and the interconnection layer, thereby reducing the contact resistance between them. Also, this method can be applied to contact window manufacturing between different levels of conductive layers with the same results.

Based on the above-mentioned objects, the invention provides a method for manufacturing contact windows in a semiconductor process to form a contact window between a first device and a second device. First, a trench is formed on a first insulating layer between the first device and a substrate and located under the predetermined position of a contact window. The trench is filled with the first device, so that the first device on the predetermined position of the contact window is thicker. Then, a second insulating layer between the first device and the second device is formed. The second insulating layer and the first device are etched so as to form a contact window, the contact area of which is larger than that of the contact window according to the prior art. In the above step, an etching stopper can be previously formed between the first insulating layer and the substrate, thereby preventing etching of the substrate. The above recited method is suitable for various kinds of contact window manufacturing in a semiconductor process. The components mentioned above can represent different physical devices in different processes. For example, in a multi-layer interconnection process, the first device and second device are two interconnection layers connected each other; in a DRAM process, the first device could be a capacitor and the second device could be an interconnection layer, wherein an etching stopper positioned under the capacitor is a bit-line. Alternately, in the DRAM process, the first device and second device could be the bit-line and interconnection layer, respectively, wherein the etching stopper serves as one electrode of the capacitor.

The structure of the capacitor manufactured according to an embodiment of the invention comprises a first insulating layer, a first conductive layer, a dielectric layer and a second conductive layer. The first insulating layer is formed on a substrate, wherein a trench used for the connection between the capacitor and interconnection layer is located on the first insulating layer. The first conductive layer is formed on the insulating layer. The dielectric layer is formed on the first conductive layer. The second conductive layer is formed on the dielectric layer and trench, such that part of the second conductive layer on the trench is thicker than that on the other regions and the etching through the second conductive layer can be prevented during an over-etching process, thereby increasing the contact area thereof.

Moreover, the invention provides a semiconductor structure by which the first and second devices on the substrate are connected to each other. The structure comprises a first insulating layer formed between the substrate and first device, wherein a trench is located under the predetermined position of the contact window between the first and second devices, such that part of the first device on the trench is thicker than the other regions, and a second insulating layer formed between the first device and second device. A contact window on the second insulating layer and first device positioned beneath the second insulating layer is used to connect the first device with the second device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The invention relates to a method for manufacturing contact windows between two different levels of conductive layers (a upper conductive layer and a lower conductive layer). First, a trench is formed under a subsequently-formed contact window between the upper conductive layer and lower conductive layer. The trench may be located on an insulating layer which is formed beneath the subsequently-formed lower conductive layer. When the lower conductive layer is subsequently formed, the trench can be filled with the lower conductive layer. Therefore, part of the lower conductive layer on the trench is thicker than that on the other regions. After an insulating layer between the upper conductive layer and lower conductive layer is formed, an etching process is then performed to form the contact window, wherein the contact window can not cross the lower conductive layer since the lower conductive layer on the trench is thick enough. In this case, the contact area between the upper conductive layer and lower conductive layer is increased, thereby reducing the contact resistance thereof. The contact window between a capacitor and an interconnection layer in the DRAM process is taken as an example to describe the characteristics of the invention hereinbelow. However, the same process can also be applied to other contact window processes. For example, a multi-layer interconnection process for manufacturing contact windows between two interconnection layers or between a bit-line and an interconnection layer.

The method for manufacturing a contact window between a capacitor and an interconnection layer disclosed in an embodiment will be described hereinafter. First, a trench located under a subsequently-formed contact window is previously formed on an insulating layer between a capacitor and a substrate. When a second conductive layer (which will be connected to an interconnection layer) of the capacitor is subsequently formed, the trench can be filled by the second conductive layer, such that part of the second conductive layer on the predetermined position of the contact window is thicker than that on the other regions. When an insulating layer between the capacitor and interconnection layer is formed, then performing an etching process to form the contact window, the contact window can not cross the second conductive layer, in that the lower conductive layer on the trench is sufficiently thick. In this case, the contact area between the second conductive layer and interconnection layer is increased, thereby reducing the contact resistance thereof.

Figure 4:
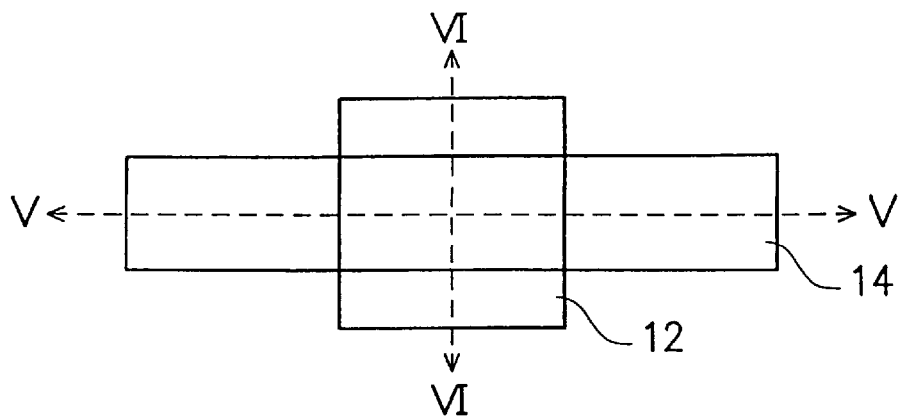
FIG. 4 is a top view showing a contact window between an interconnection layer and a second conductive layer of a capacitor according to an embodiment of the invention.

FIG. 4 is a top view illustrating a contact window between an interconnection layer and a second conductive layer of a capacitor according to an embodiment of the invention. In FIG. 4, numeral 12 represents the position of the contact window between the interconnection layer and capacitor, and numeral 14 represents the position of the formed trench in the embodiment. In the embodiment, although a formed trench 14 is strip-shaped as shown in FIG. 4, it will not be limitative of the invention. That is, the shape of the trench 14 could be square or polygonal, but whatever the shape is, there should be a overlapped region between the trench 14 and contact window 12. The FIGS. 5a~5h are cross-sectional views along the line V—V of FIG. 4. The FIG. 6 is a cross-sectional view along the line VI—VI of FIG. 4. The process of the invention will be described according to FIGS. 5a~5h hereinbelow.

Figure 5A:
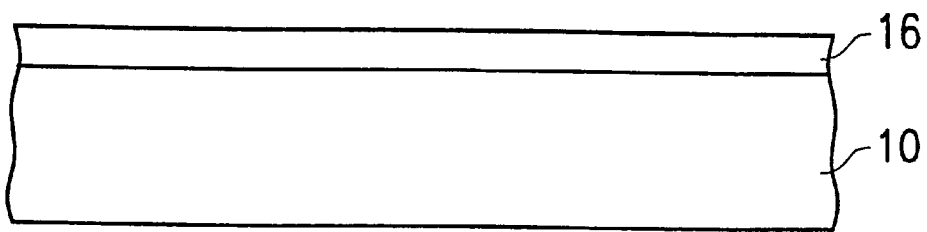
FIGS. 5a~5h are cross-sectional views along the line V—V of FIG. 4 showing the process according to the embodiment of the invention.

In FIG. 5a, the numerals 10 and 16 represent a substrate and a conductive layer serving as a bit-line formed before the capacitor, respectively. The bit-line is formed together with other bit-lines by a conventional process. Basically, the bit-line need not be connected with other bit-lines. Furthermore, required MOS devices have been already formed on the substrate 10. FIGS. 5a~5h include a silicon substrate and an insulating layer for separating the bit-line from the MOS devices. The conductive layer 16 may be made from poly-silicon or metal polyside. The following steps are substantially performed together with the prior DRAM process, but no excessive process is added. In order to clearly understand the characteristics of the embodiment, please refer to FIG. 1 showing a method for manufacturing a capacitor in a typical DRAM memory cell simultaneously during the following description.

Figure 1:
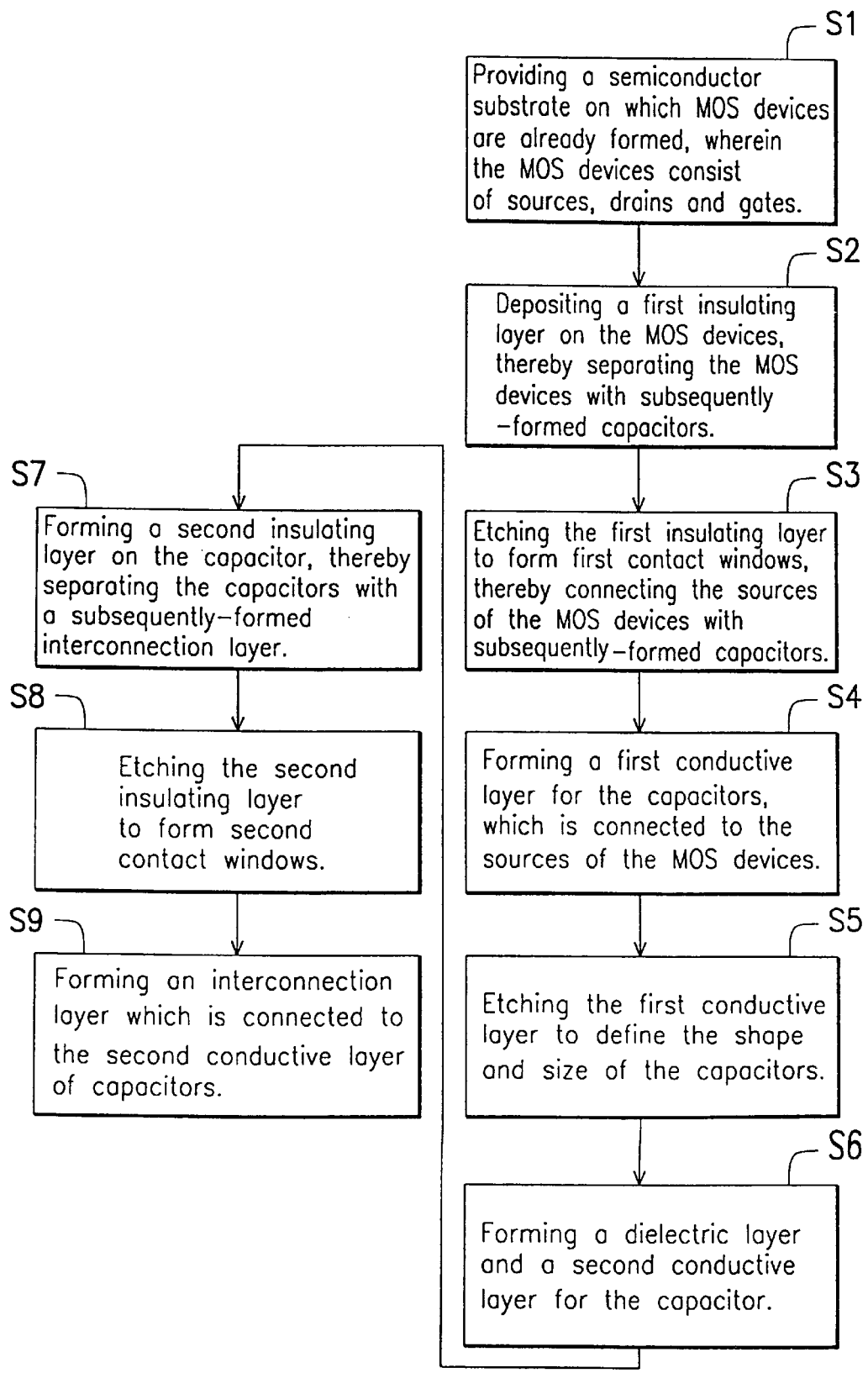
FIG. 1 is a flow chart illustrating a method for manufacturing a capacitor inside a typical DRAM memory cell.
Figure 2:
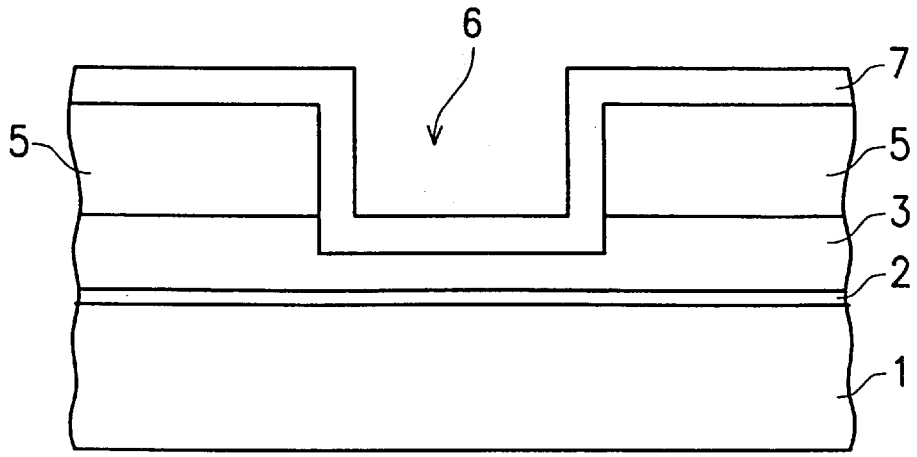
FIG. 2 is a cross-sectional view showing a contact window between an interconnection layer and a second conductive layer of a capacitor, wherein the bottom of the contact window is located inside the second conductive layer, according to a first example of the prior art.
Figure 3:
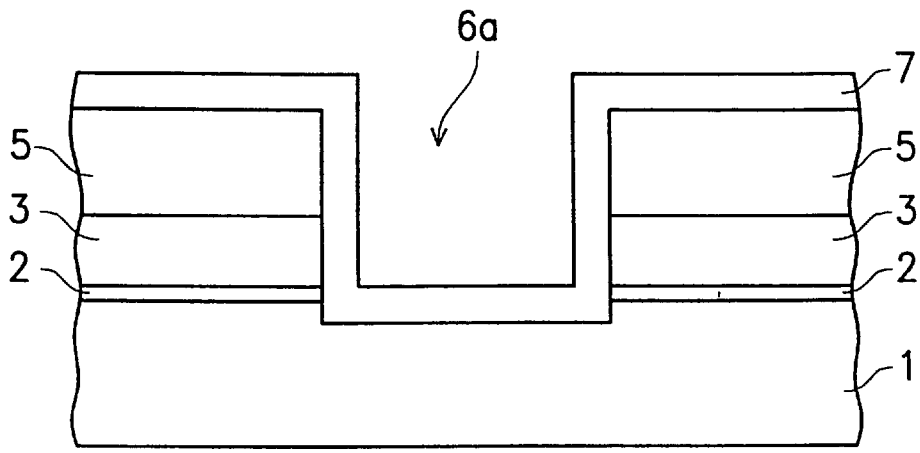
FIG. 3 is a cross-sectional view showing a contact window between an interconnection layer and a second conductive layer of a capacitor, wherein the bottom of the contact windows is located under the second conductive layer, according to a second example of the prior art.
Figure 5B:
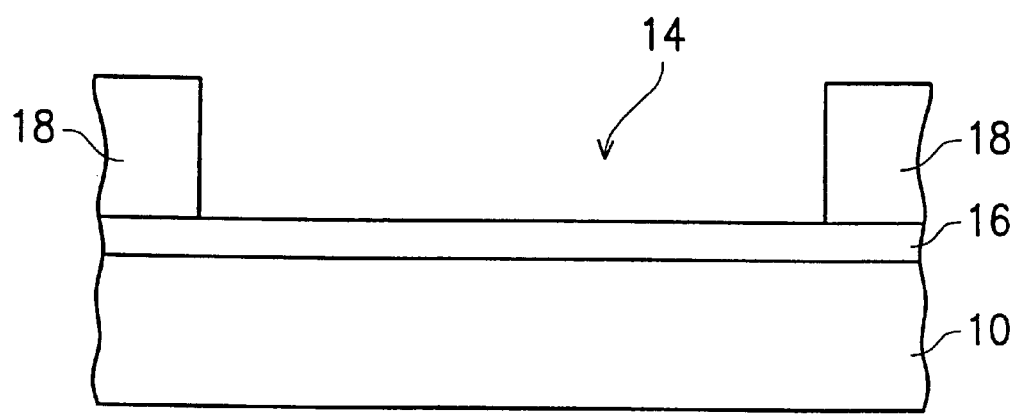
Figure 6:
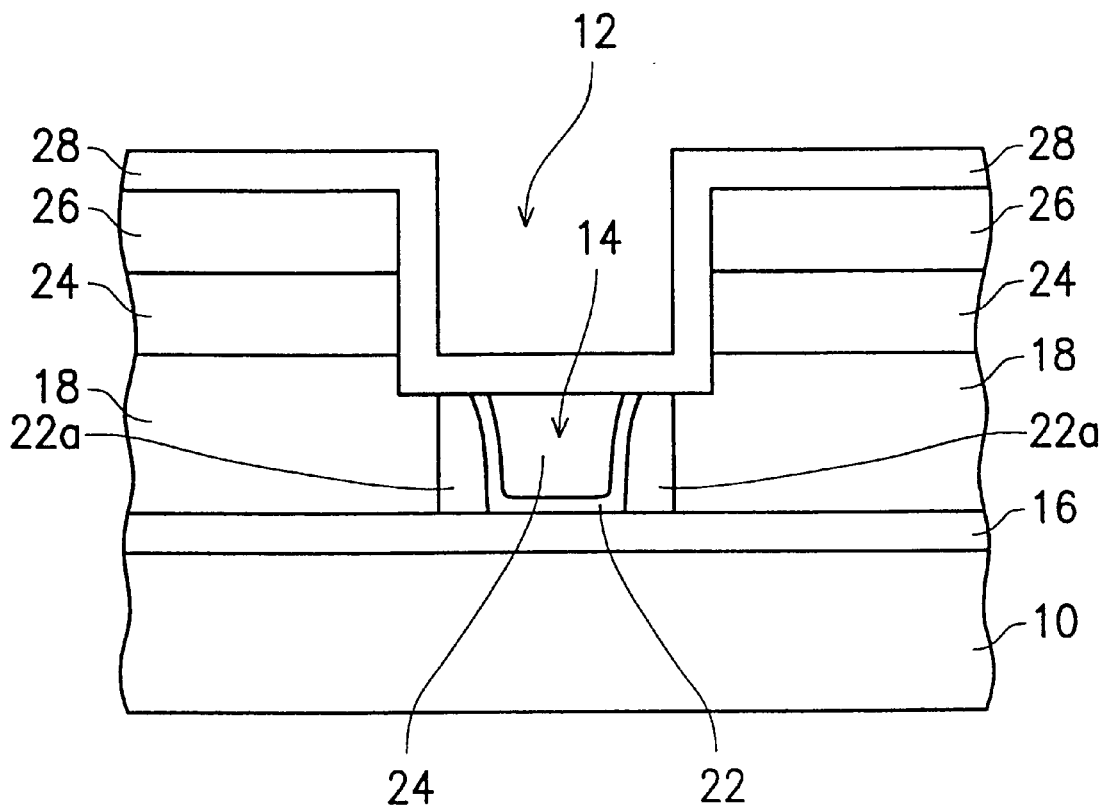
FIG. 6 is a cross-sectional view along the line VI—VI of FIG. 4 showing the contact window between the capacitor and interconnection layer.

In FIG. 5b, a first insulating layer 18 is formed over a conductive layer 16 and a substrate 10 and this step is performed together with S2 of FIG. 1. The material of the first insulating layer 18 may be non-doped silicon glass (NSG), phosphorus-silicon glass (PSG), boron-phosphorus-silicon glass (BPSG) or nitride which is used for separating the MOS devices from subsequently-formed capacitors in the prior DRAM process. The first insulating layer 18 is etched by a photolithographic process and an etching process in order to form a trench 14 (as shown in FIG. 4) in a step performed together with S3 of FIG. 1. That is, forming the trench 14, and etching the contact window used for connection between the source of the MOS device and capacitor are performed at the same time. The shape and dimensions of the trench 14 depend on the requirements of the designers and limitations in the practical process. Moreover, the conductive layer 16 serves as an etching stopper when the trench 14 is formed by the etching process, thereby preventing over-etching which damages the lower layer.

Figure 5C:
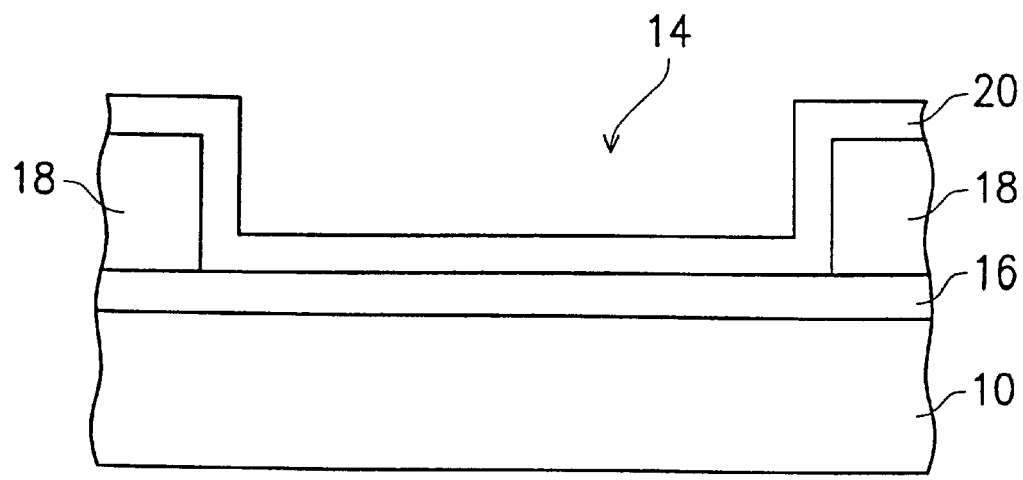
Figure 5D:
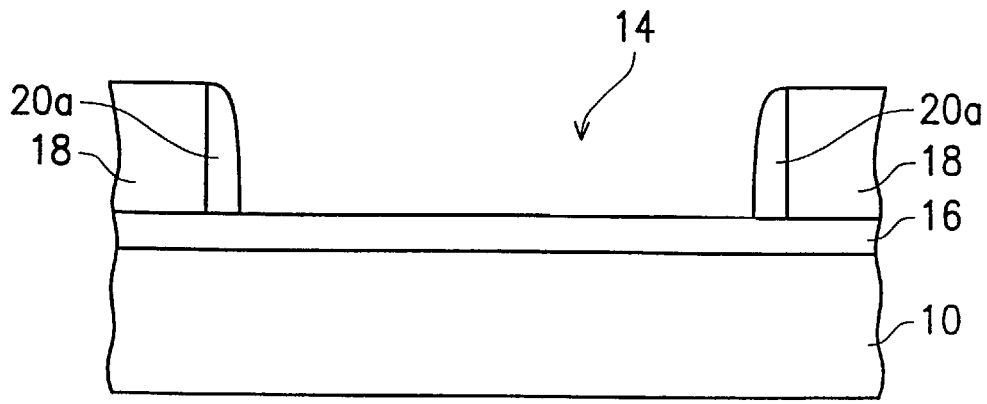

Referring to FIG. 5c, a first conductive layer 20 is formed on the first insulating layer 18 and trench 14 in a step performed together with S4 of FIG. 1. The material of the first conductive layer 20 of the capacitor may be poly-silicon, metal poly-silicide or aluminum alloy. In a step as shown in FIG. 5d, the first conductive layer 20 is etched in order to form conductive spacers 20a simultaneously by the etching process for defining the capacitor of FIG. 1. In the embodiment, since the etching for defining the first conductive layer 20 is a more precise anisotropic dry etching, the conductive spacers 20a can be formed. However, the invention is suitable for the case in which the shape and dimensions of the capacitor are defined by an isotropic etching. In this case, the conductive spacers 20a will not be created.

Figure 5E:
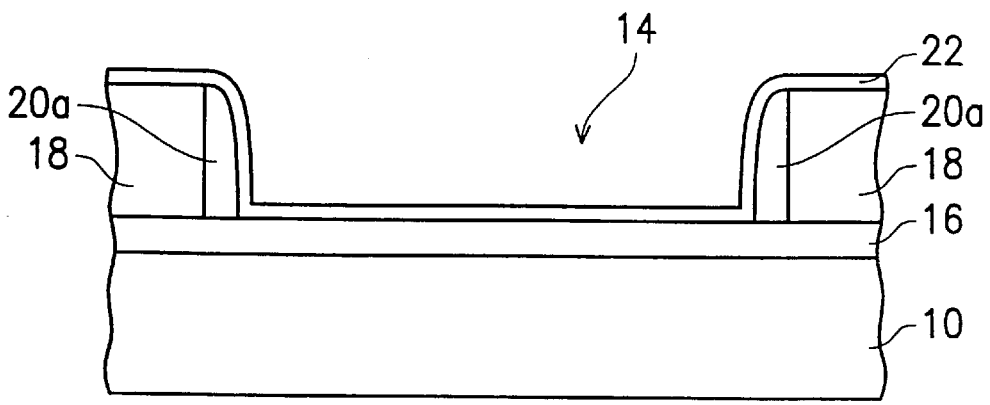
Figure 5F:
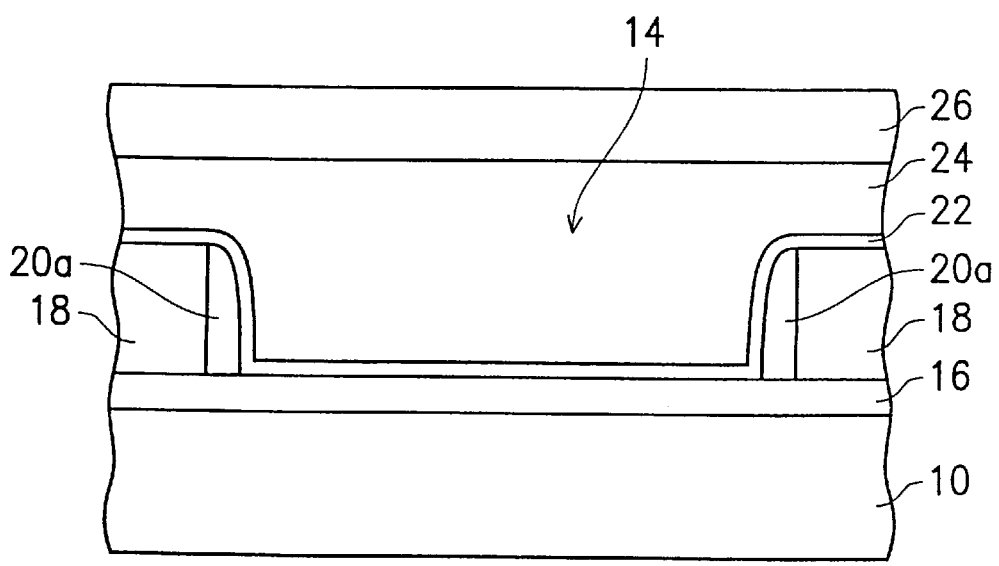

Next, as shown in FIG. 5e, a dielectric layer 22 is formed on the first insulating layer 18, conductive spacers 20a and trench 14 in a step performed together with S6 of FIG. 1. Then, as shown in FIG. 5f, a second conductive layer 24 and second insulating layer 26 are subsequently formed on the dielectric layer 22 in a step performed together with S6 and S7 of FIG. 1. The materials of the second conductive layer and second insulating layer 26 are the same as that of the first conductive layer 20 and first insulating layer 18. As shown in FIG. 5f, since the trench 14 is filled with the second conductive layer 24, part of the second conductive layer 24 on the trench 14 is thicker than that on the other regions. In other words, when forming the contact window between the capacitor and interconnection layer by an etching process, the second conductive layer 24 over the trench 14 can provide a greater etching tolerance.

Figure 5G:
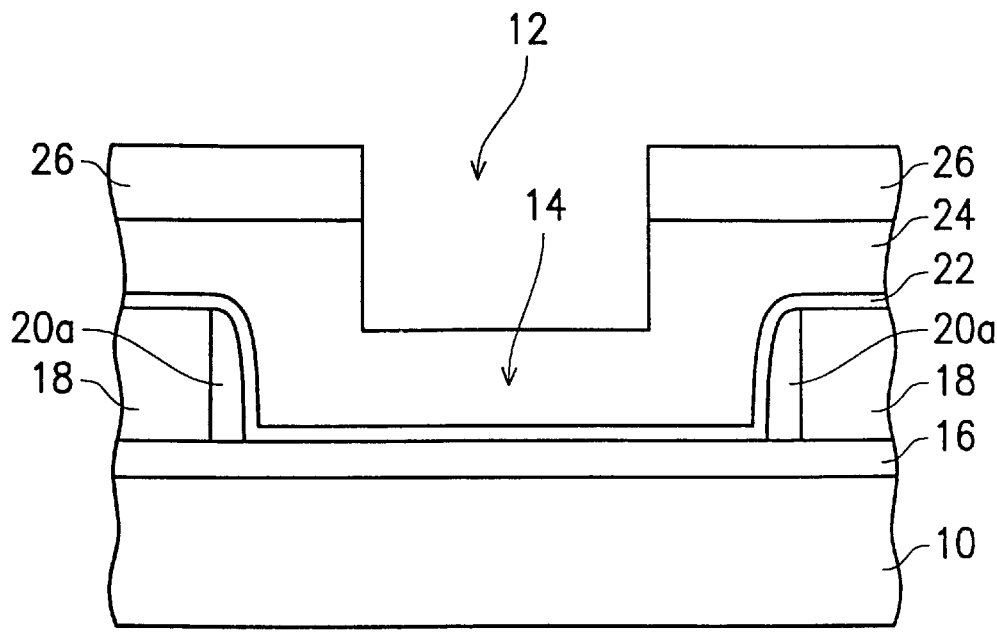
Figure 5H:
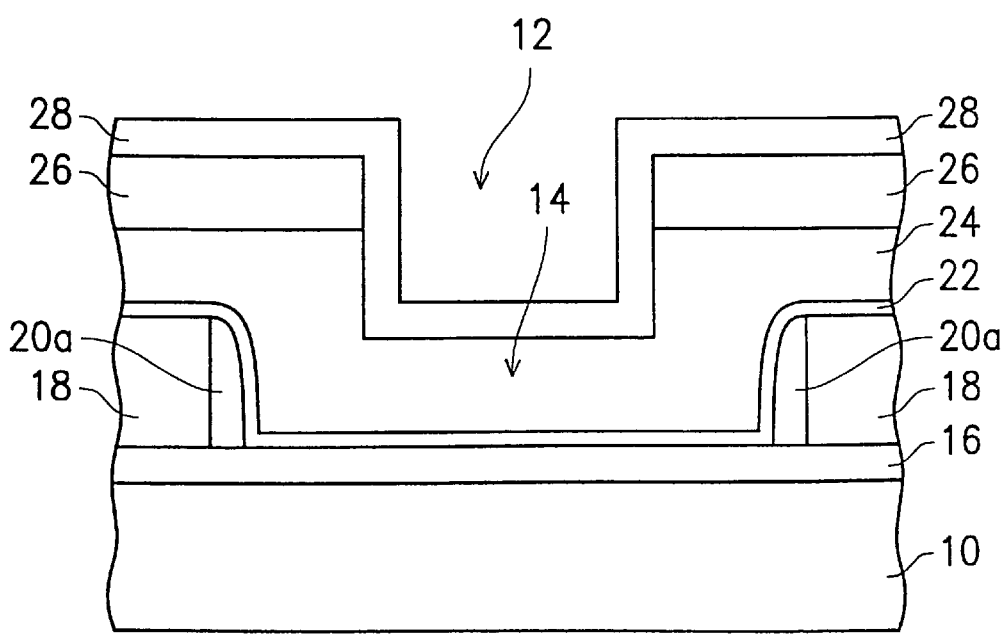

As shown in FIG. 5g, the second insulating layer 26 is etched in order to form a second contact window 12. In FIG. 5g, since the etching thickness is greater than the thickness of the second insulating layer 26, part of the second conductive layer 24 is removed during the etching process. Therefore, when an interconnection layer 28 is formed in FIG. 5h, the contact area on the side walls and bottom of the second contact window 12 can be provided. In comparison with the prior art, the invention can accurately provide greater contact area between the capacitor and interconnection layer.

The above-mentioned embodiment of the invention is described by a process in which the bit-line is formed before the capacitor. However, this is not intended to limit the invention. Another process in which the capacitor is formed before the bit-line can also be performed by the same principle of the invention. That is a trench can be formed on the insulating layer between the bit-line and capacitor so as to form a thicker bit-line over the contact window. Moreover, the same process is also suitable for manufacturing the contact windows of other devices.

The advantages of the invention are as follows:

1. The thickness of the capacitor's second conductive layer is increased by previously forming the trench. Therefore, in the step of etching the contact window for the connection of the capacitor and interconnection layer, shrinkage of the contact areas caused by over-etching effect can be prevented. In fact, the invention may even provide greater contact area than the prior art.

2. According to the invention, since no excessive process is required and the fabrication cost is reduced, the method of the invention is suitable for wide application in the semiconductor industry.

Although the invention has been disclosed in terms of a preferred embodiment, the disclosure is not intended to limit the invention. Those knowledgeable in the art can make modifications within the scope and spirit of the invention which is determined by the claims appended below.

What is claimed is:

1. A method for manufacturing a contact window, comprising the steps of:

(a) providing a substrate having a first conductive layer and a first insulating later covering the first conductive layer;

(b) forming a trench within the first insulating layer to expose the first conductive layer, wherein the trench is located under a predetermined position of the contact window;

(c) forming a conductive spacer on a sidewall of the trench;

(d) forming a dielectric layer to cover the surfaces of the first conductive layer, the first insulating layer and the conductive spacer;

(e) filling the trench with a second conductive layer to cover the dielectric layer, such that a portion of the second conductive layer located on the predetermined position is thicker than that of adjacent regions;

(f) forming a second insulating layer on the second conductive layer;

(g) etching the second insulating layer and the second conductive layer to expose the contact window; and (h) forming a third conductive layer on the surface of the contact window.

2. The method as claimed in claim 1 wherein the second conductive layer is a top electrode of a capacitor.

3. The method as claimed in claim 2 wherein the first conductive layer is a bottom electrode of a capacitor.

4. The method as claimed in claim 1 wherein the third conductive layer is an interconnection layer.

5. The method as claimed in claim 1 wherein the first conductive layer is a bit-line.

6. The method as claimed in claim 1 wherein the first conductive layer is a bit-line contact plug.

7. The method as claimed in claim 1 wherein the first conductive layer serves as an etching stopper during the formation of the trench.

* * * * *